US010461223B2

(12) United States Patent
Chang et al.

(10) Patent No.: US 10,461,223 B2
(45) Date of Patent: Oct. 29, 2019

(54) SEMICONDUCTOR DEVICE

(71) Applicant: EPISTAR CORPORATION, Hsinchu (TW)

(72) Inventors: Yung-Fu Chang, Hsinchu (TW); Hsin-Chan Chung, Hsinchu (TW); Hung-Ta Cheng, Hsinchu (TW); Wen-Luh Liao, Hsinchu (TW); Shih-Chang Lee, Hsinchu (TW); Chih-Chiang Lu, Hsinchu (TW); Yi-Ming Chen, Hsinchu (TW); Yao-Ning Chan, Hsinchu (TW); Chun-Fu Tsai, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/128,604

(22) Filed: Sep. 12, 2018

(65) Prior Publication Data
US 2019/0081213 A1 Mar. 14, 2019

(30) Foreign Application Priority Data

Sep. 13, 2017 (TW) .............................. 106131485 A

(51) Int. Cl.
*H01L 33/38* (2010.01)
*H01L 33/30* (2010.01)
(52) U.S. Cl.
CPC .............. *H01L 33/38* (2013.01); *H01L 33/30* (2013.01)

(58) Field of Classification Search
CPC ................................. H01L 33/38; H01L 33/30
See application file for complete search history.

(56) References Cited

U.S. PATENT DOCUMENTS 9,705,040 B2* 7/2017 Ha ........................... H01L 33/38
2013/0328055 A1* 12/2013 Tajima ..................... H01L 33/40
257/76

* cited by examiner

*Primary Examiner* — David Vu
(74) *Attorney, Agent, or Firm* — Muncy, Geissler, Olds & Lowe, P.C.

(57) ABSTRACT

A semiconductor device includes a semiconductor stack comprising a surface, and an electrode structure comprises an electrode pad formed on the surface, and the electrode structure further comprises a first extending electrode, a second extending electrode and a third extending electrode connecting to the electrode pad. The first extending electrode is closer to a periphery of the surface than the third extending electrode is, and the second extending electrode is between the first extending electrode and the third extending electrode. From a top view of the semiconductor device, the first extending electrode, the second extending electrode and the third extending electrode respectively include a first curve having a first angle θ1, a second curve having a second angle θ2 and a third curve having a third angle θ3, wherein θ3>θ2>θ1.

14 Claims, 4 Drawing Sheets

SEMICONDUCTOR DEVICE

TECHNICAL FIELD

The application relates to a structure of a semiconductor device, and more particularly, to a semiconductor device including an extending electrode.

DESCRIPTION OF BACKGROUND ART

Semiconductor device includes semiconductor compounds composed of III-V group elements, such as gallium phosphide (GaP), gallium arsenide (GaAs) or gallium nitride (GaN). The semiconductor device can be optoelectronic semiconductor device such as light-emitting device (LED), laser, photodetector, or solar cell, or can be power device such as switch or rectifier. The LED includes a p-type semiconductor structure, an n-type semiconductor structure and an active structure between the p-type semiconductor structure and the n-type semiconductor structure for emitting light under the principle of transforming electrical energy to optical energy by injecting electrons and holes through the n-type semiconductor structure and the p-type semiconductor structure respectively to the active structure to perform radiative combination and emit light. The research is continued to enhance the conversion efficiency of the optoelectronic semiconductor device.

SUMMARY OF THE APPLICATION

A semiconductor device includes a semiconductor stack comprising a surface, and an electrode structure includes an electrode pad formed on the surface, and the electrode structure further includes a first extending electrode, a second extending electrode and a third extending electrode connecting to the electrode pad. The first extending electrode is closer to a periphery of the surface than the third extending electrode is, and the second extending electrode is between the first extending electrode and the third extending electrode. From a top view of the semiconductor device, the first extending electrode, the second extending electrode and the third extending electrode respectively include a first curve having a first angle θ1, a second curve having a second angle θ2 and a third curve having a third angle θ3, wherein θ3>θ2>θ1。

DETAILED DESCRIPTION OF PREFERRED EMBODIMENTS

Figure 1:
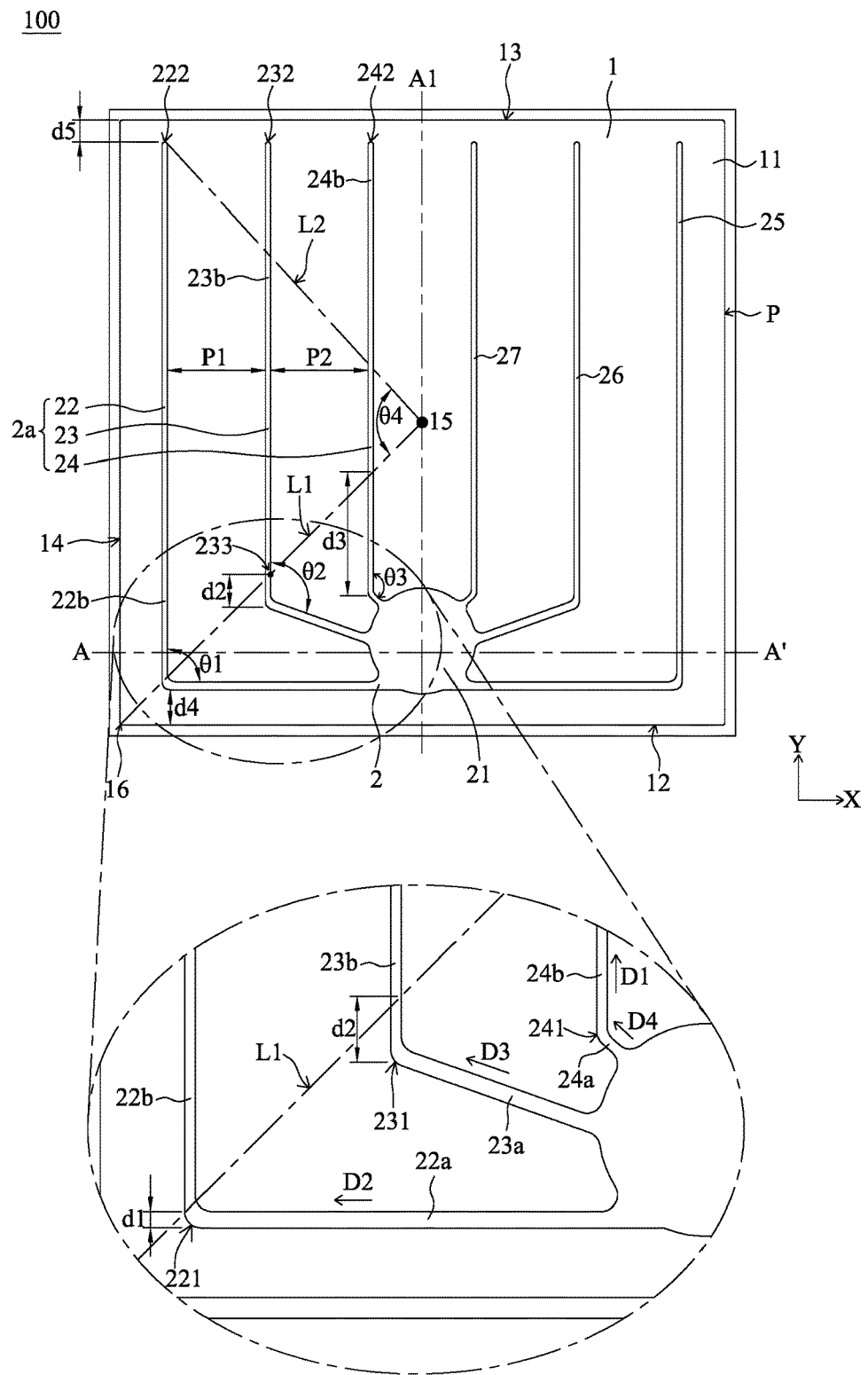
FIG. 1 illustrates a top view of a semiconductor device in accordance with the first embodiment of the present application.

The embodiment of the application is illustrated in detail, and is plotted in the drawings. The same or the similar part is illustrated in the drawings and the specification with the same or the similar number.

Figure 2:
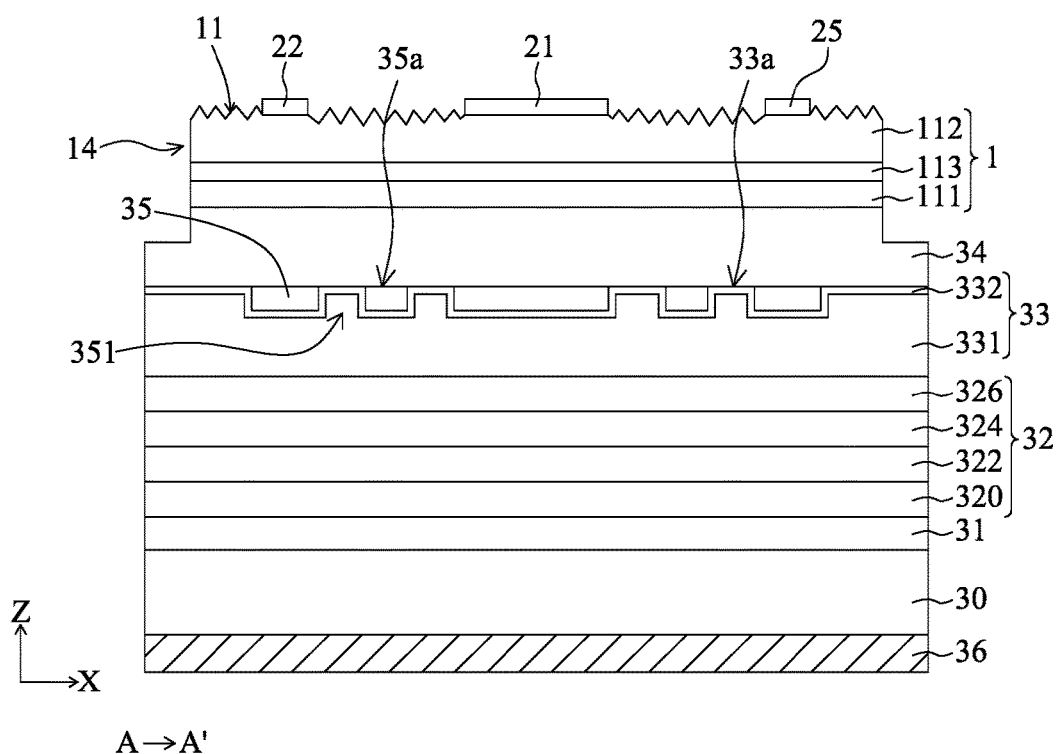
FIG. 2 illustrates a cross-sectional view of the semiconductor device of FIG. 1 in accordance with the first embodiment of the present application.

FIGS. 1 and 2 respectively illustrate a top view and a cross section view of a semiconductor device in accordance with the first embodiment of the present application. The semiconductor device 100 includes a semiconductor stack 1 and an electrode structure 2. The semiconductor stack 1 has a surface 11 and the electrode structure 2 locates on the surface 11. More specifically, from a top view of the semiconductor device 100, the surface 11 of the semiconductor stack 1 includes a periphery P. The periphery P has a first side 12, a second side 13 and a lateral side 14 connecting to the first side 12 and the second side 13. The first side 12 is opposite to the second side 13. The electrode structure 2 includes an electrode pad 21 adjacent to the first side 12, and an extending electrode assemble 2a substantially extends from the first side 12 toward the second side 13. The extending electrode assemble 2a includes a first extending electrode 22, a second extending electrode 23 and a third extending electrode 24 respectively connected to the electrode pad 21. The electrode structure 2 electrically connects to the semiconductor stack 1, and the electrode pad 21 can be electrically connected to an outer circuit via metal conductive line or conductive adhesive layer (such as solder or conductive paste). The electrode pad 21 can be configured to inject current from outer source to the semiconductor stack 1. The extending electrodes 22, 23, and 24 can be configured to spread current injected by the electrode pad 21 into different areas of the semiconductor stack 1. In the embodiment, the first extending electrode 22 is closer to the periphery P of the semiconductor stack 1 than the third extending electrode 24 to the periphery P. The second extending electrode 23 locates between the first extending electrode 22 and the third extending electrode 24. More specifically, the first extending electrode 22 is closer to the first side 12 and the lateral side 14 of the semiconductor stack 1 than the second, third extending electrode 23, 24 to the first side 12 and the lateral side 14. Moreover, the first extending electrode 22 includes a first curve 221 having a first angle θ1, the second extending electrode 23 includes a second curve 231 having a first angle θ2, and the third extending electrode 24 includes a second curve 223 having a first angle θ3, wherein θ3>θ2>θ1. The current injected from the electrode pad 21 can be evenly spread to the semiconductor stack 1 with the design of the electrode structure 2 in the embodiment so the semiconductor device 100 has better current spreading than that of conventional LED device. Besides, the second angle θ2 and the third angle θ3 are obtuse angles, which are larger than 90 degree. Preferably, the first angle θ1 is in a range of 80 degree to 110 degree, the second angle θ2 is in a range of 90 degree to 125 degree, and the third angle θ3 is in a range of 110 degree to 145 degree. Moreover, a distance between the first curve 221 and the electrode pad 21 is larger than a distance between the second curve 231 and the electrode pad 21, and a distance between the third curve 223 and the electrode pad 21 is smaller than a distance between the second curve 231 and the electrode pad 21.

Referring to FIG. 1, the first extending electrode 22, the second extending electrode 23 and the third extending electrode 24 in the embodiment includes a first end 222, the second end 232 and the third end 242 away from the electrode pad 21 respectively. The first end 222, the second end 232 and the third end 242 are aligned with one another. However, the disclosure is not limited thereto. Besides, the first extending electrode 22 includes a first part 22a between the electrode pad 21 and the first curve 221, and a second part 22b between the first curve 221 and the first end 222. The second extending electrode 23 includes a first part 23a between the electrode pad 21 and the second curve 231, and a second part 23b between the second curve 231 and the second end 232. The third extending electrode 24 includes a first part 24a between the electrode pad 21 and the third curve 241, and a second part 24b between the third curve 241 and the third end 242. As shown in FIG. 1, the second part 22b of the first extending electrode 22, the second part 23b of the second extending electrode 23 and the second part 24b of the third extending electrode 24 have a first extending direction D1 substantially parallel to the lateral side 14. The first extending direction D1 is substantially parallel to the Y-axis of FIG. 1. Besides, in the embodiment, the first part 22a of the first extending electrode 22 has a second extending direction D2, the first part 23a of the second extending electrode 23 has a third extending direction D3, and the first part 24a of the third extending electrode 24 has a fourth extending direction D4. The second, third, fourth extending directions D2, D3, D4 are substantially not parallel with one another. The second extending direction D2 is substantially parallel to the X-axis of FIG. 1, and the first extending direction D1 is substantially perpendicular to the second extending direction D2. Moreover, the second parts 22b, 23b, 24b of the adjacent extending electrodes 22, 23, 24 substantially have the same pitch. More specifically, a first pitch P1 between the second part 22b of the first extending electrode 22 and the second part 23b of the second extending electrode 23 is substantially the same as a second pitch P2 between the second part 23b of the second extending electrode 23 and the second part 24b of the third extending electrode 24. The current spreading ability of the semiconductor device 100 can be enhanced through the "same pitch" design disclosed in the embodiment. Besides, the first parts 22a, 23a, 24a of the adjacent extending electrodes 22, 23, 24 substantially have different pitches. For example, in an embodiment, at least a distance between adjacent first parts 22a, 23a, 24a of the extending electrodes 22, 23, 24 is increased or decreased toward the direction away from the electrode pad 21. The trend of the increasing way or the decreasing way includes but not limits to arithmetic progression, geometric progression, stepwise or continuously various way.

Moreover, as shown in FIG. 1, from the top view of the semiconductor device 100, the semiconductor stack 11 includes a center 15 and a corner 16 away from the center 15 and adjacent to the electrode pad 2. A distance between the first curve 221 and the center 15 is larger than a distance between second curve 231 and the center 15. The third corner 241 is closer to the center 15 than the second corner 231 to the center 15. A first virtual line L1 is between the corner 16 and the center 15. In other words, the first virtual line L1 is a connection of the corner 16 and the center 15. A first distance d1 is between the first curve 221 of the first extending electrode 22 and the first virtual line L1 along the first extending direction D1. A second distance d2 is between the second curve 231 of the second extending electrode 23 and the first virtual line L1 along the first extending direction D1. A third distance d3 is between the third curve 241 of the third extending electrode 24 and the first virtual line L1 along the first extending direction D1. The second distance d2 is larger than the first distance d1, and the third distance d3 is preferably larger than the second distance d2. In the embodiment, a ratio of the third distance d3 to the second distance d2 can be but not limited to be between about 3~6, or 4.3~5.2. In one embodiment, the first virtual line L1 is across the first curve 221 and the first distance d1 is substantially zero. From the top view of the semiconductor device 100, the surface 11 of the semiconductor stack 15 in the first embodiment includes four corners, and the corner 16 is the corner closest to the electrode pad 21 and locates on a intersection of the first side 12 and the lateral side 14. Moreover, the second extending electrode 23 encounters the first virtual line L1 at an intersection 233, and a distance between the intersection 233 and the center 15 is not less than a distance between the intersection 233 and the corner 16. The center 15 of the surface 11 of the semiconductor stack 1 in the embodiments of the disclosure is overlapped with the geometric center or close to the geometric center. For example, a distance between the center 15 and the geometric center of the surface 11 is about 0.5%~8% of a length of the first side 12.

As shown in FIG. 1, in the first embodiment, a second virtual line L2 is between the first end 222 of the first extending electrode 222 and the center 15. In other words, the second virtual line L2 is a connection of the first end 222 and the center 15. An angle θ4 between the second virtual line L2 and the first virtual line L1 is preferably smaller than about 120 degree, or smaller about 105 degree and not smaller than 90 degree. Moreover, the first extending electrode 22 substantially extends from the first side 12 toward the second side 13, and a smallest distance, which is a fourth distance d4, is between the first part 22a of the first extending electrode 22. A smallest distance, which is a fifth distance d5, between the first end 222 and the second side 13 is smaller than the fourth distance d4. In the first embodiment, the surface 11 includes a virtual middle line A1 parallel to the first extending direction D1 and across the center 15. The extending electrode assemble 2a further includes a fourth extending electrode 25, a fifth extending electrode 26 and a sixth extending electrode 27 respectively connect to the electrode pad 21. The fourth extending electrode 25, the fifth extending electrode 26 and the sixth extending electrode 27 are mirror-symmetric to the first extending electrode 22, the second extending electrode 23 and the third extending electrode 24 respectively when the virtual middle line A1 acts as a mirror. However, the layout of the electrode structure 2 is not limited to mirror-symmetric, it can be antisymmetric or other symmetric types. When the semiconductor device 100 is an optoelectronic semiconductor device or light-emitting device and the surface 11 is one of the emitting surface, the percentage of a surface area of the electrode pad 21 to a surface area of the surface 11 is not larger than 5%, or between 1%~3% to decrease the shielding of the light by the electrode pad 21. In the first embodiment, the percentage of a surface area of the electrode pad 21 to the surface area of the surface 11 is about 1.5%~2.6%. The virtual middle line A1 is parallel to the first extending direction D1 and across the center 15. However, in the other embodiment, the surface 11 of the semiconductor device 1 is divided into two equal areas by the virtual middle line A1. Besides, the amount of the extending electrode of the extending electrode assemble 2a is not limited to six. For example, the extending electrode assemble 2a can include larger amount of the extending electrode when the semiconductor stack 1 has larger surface 11, in order to spread the current evenly to the semiconductor device 1. In some embodiment, the extending electrode assemble 2a includes 3~15 extending electrodes. Moreover, in order to balance the light shielded of the semiconductor device 100 and the current spreading, the electrode structure 2 can be further optimized, for example, a percentage of the surface area of the electrode structure 2 to the surface area of the surface 11 of the semiconductor is in a range of 6% to 15%. The semiconductor device 100 connects to the outer circuit through the electrode pad 21 to form the electrical connection between the electrode pad 21 and the outer circuit by metal line bonding or flip-chip bonding, for example. Besides, the amount of the electrode pad with the same electrical type can be determined according to the size of the surface 11 and the current spreading of the semiconductor device 100. Preferably, in the first embodiment of the disclosure, the electrode structure 2 includes only single electrode pad 21 on the surface 11 to prevent the light emitted from the semiconductor device 1 from being shielded by the metal line across the surface 11 when wire bonding technology is performed. Therefore, the optoelectronic conversion efficiency of the semiconductor device 100 is optimized after forming a package.

FIG. 2 illustrates a cross section view of FIG. 1 along line A-A'. Besides the semiconductor stack 1 and the electrode structure 2 on the semiconductor stack 1, the semiconductor device 100 in the embodiment further includes a substrate 30, a conductive adhesive layer 31 between the substrate 30 and the semiconductor stack 1, a reflective structure 32 between the conductive adhesive layer 31 and the semiconductor stack 1, a transparent conductive structure 33 between the reflective structure 32 and the semiconductor stack 1, a window layer 34 between the transparent conductive structure 33 and the semiconductor stack 1, and an insulating layer 35 between the transparent conductive structure 33 and the window layer 34. The structure of the semiconductor device 100 is not limited to the above mentioned elements. For example, in another embodiment, besides the substrate 30, the semiconductor stack 1 on the substrate 30 and the electrode structure 2 on the semiconductor stack 1, the semiconductor device 100 includes one or more elements disclosed in the first embodiment. The semiconductor device 100 further includes a second electrode structure 36, which has different electrical type from that of the electrical structure, on the substrate 30 and away from the semiconductor stack 1 The electrode structure 2 and the second electrode structure 36 locate on the opposite sides of the semiconductor stack 1 respectively to form a vertical semiconductor device 100. The semiconductor device 100 shown in the first embodiment is just for example but not for the purpose to limit the scope of the disclosure. For example, the electrode structure 2 and the second electrode structure 36 can also locate on the same side of the semiconductor stack 1 to form a horizontal semiconductor device 100.

The electrode structure 2 and the second electrical electrode 36 can be designated to connect to the outer electrical source and spread the current evenly into the semiconductor stack 1. In the first embodiment, the second electrode structure 36 is formed on a backside of the substrate 30 as a conductive film. The material of the second electrode structure 36 and the electrode structure 2 can be the same or different, such as metal material or transparent conductive material. In the first embodiment, the material of the electrode structure 2 and the second electrode structure 36 include metal. The metal material can be but not limited to aluminum (Al), chromium (Cr), copper (Cu), tin (Sn), gold (Au), nickel (Ni), titanium (Ti), platinum (Pt), plumbum (Pb), zinc (Zn), cadmium (Cd), antimony (Sb), cobalt (Co) or the alloy of the above materials. The transparent conductive material can be but not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), aluminum gallium arsenide (AlGaAs), gallium nitride (GaN), gallium phosphide (GaP), gallium arsenide (GaAs), gallium arsenide phosphide (GaAsP), diamond-like carbon (DLC) or graphene.

The semiconductor stack 1 includes a first semiconductor structure 111, an active structure 113 and a second semiconductor structure 112 sequentially formed on the first semiconductor structure 111. The first semiconductor structure 111 and the second semiconductor structure 112 have a first conductive type and a second conductive type different from the first conductive type respectively in order to respectively provide electron and hole, or hole and electron. The active structure 113 can include single heterostructure, double heterostructure or multiple quantum wells. The materials of the first semiconductor structure 111, the second semiconductor structure 112 and the active structure 113 include III-V group semiconductor compounds, such as GaAs, InGaAs, AlGaAs, AlInGaAs, GaP, InGaP, AlInP, AlGaInP, GaN, InGaN, AlGaN, AlInGaN, AlAsSb, InGaAsP, InGaAsN, or AlGaAsP. In embodiments of the present disclosure, if not described otherwise, the above-mentioned chemical formulas include "stoichiometric compounds" and "non-stoichiometric compounds". A "stoichiometric compound" is, for example, a compound in which the total number of atoms of III-group elements is the same as the total number of atoms of V-group elements. On the contrary, a "non-stoichiometric compound" is, for example, a compound in which the total number of atoms of III-group elements is different from the total number of atoms of V-group elements. For example, a compound has a chemical formula of AlGaAs represents that the compound includes Al and/or Ga as III-group elements, and As as V-group element, wherein the total number of atoms of the III-group elements (Al and/or Ga) and the total number of atoms of the V-group elements (As) may be the same or different. In addition, if the above-mentioned compounds represented by the chemical formulas are stoichiometric compounds, then AlGaAs represents for $Al_xGa_{(1-x)}As$, wherein $0 \le x \le 1$; AlInP represents for $Al_xIn_{(1-x)}P$, wherein $0 \le x \le 1$; AlGaInP represents for $(Al_yGa_{(1-y)})_{1-x}In_xP$, wherein $0 \le x \le 1$, and $0 \le y \le 1$; AlGaN represents for $Al_xGa_{(1-x)}N$, wherein $0 \le x \le 1$; AlAsSb represents for $AlAs_xSb_{(1-x)}$, wherein $0 \le x \le 1$; InGaP represents for $In_xGa_{1-x}P$, wherein $0 \le x \le 1$; InGaAsP represents for $In_xGa_{1-x}As_{1-y}P_y$, wherein $0 \le x \le 1$, and $0 \le y \le 1$; InGaAsN represents for $In_xGa_{1-x}As_{1-y}N_y$, wherein $0 \le x \le 1$, and $0 \le y \le 1$; AlGaAsP represents for $Al_xGa_{1-x}As_{1-y}P_y$, wherein $0 \le x \le 1$, and $0 \le y \le 1$; InGaAs represents for $In_xGa_{1-x}As$, wherein $0 \le x \le 1$. When the semiconductor device in the disclosure is a light-emitting device, the semiconductor stack 1 can emit a light with a dominant wavelength of about 200 nm~1800 nm. In the first embodiment, the semiconductor stack 1 can emit an infrared light with a dominant wavelength of about 750 nm~1500 nm. Moreover, the conductive type of the window layer 34 can be the same as that of the first semiconductor structure 111, such as n type or p type. The window layer 34 is transparent to the light emitted from the semiconductor stack 1, and the material can include transparent conductive material, such as indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), magnesium oxide (MgO), gallium arsenide (GaAs), aluminum gallium arsenide (AlGaAs), gallium nitride (GaN), gallium phosphide (GaP) or indium zinc oxide (IZO).

The transparent conductive structure 33 is transparent to light emitted from the semiconductor stack 1 for enhancing the ohmic contact and current conductivity between the window layer 34 and the reflective structure 32. In some embodiments, the transparent conductive structure 33 and the reflective structure 32 together form an Omni-Directional Reflector (ODR). The material of the transparent conductive structure 33 can include transparent conductive material, such as indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), tungsten doped indium oxide (IWO), zinc oxide (ZnO), gallium phosphide (GaP), indium cerium oxide (ICO), indium titanium oxide (ITiO), indium zinc oxide (IZO), indium gallium oxide (IGO), aluminum gallium zinc oxide (GAZO), graphene or the combination of the above materials. As shown in FIG. 2, in the first embodiment, the transparent conductive structure 33 includes a first transparent conductive layer 331 under the insulating layer 35 and a second transparent conductive layer 332 between the semiconductor stack 1 and the first transparent conductive layer 331. The material of the first transparent conductive layer 331 is different from that of the second transparent conductive layer 332. In another embodiment, at least one of the elements of the first transparent conductive layer 331 is different from that of the second transparent conductive layer 332. For example, the material of the first transparent conductive layer 331 is indium zinc oxide (IZO) and the material of the second transparent conductive layer 332 is indium tin oxide (ITO). The second transparent conductive layer 332 can directly contact the insulating layer 35 and the window layer 34, and cover at least one surface of the insulating layer.

As shown in FIG. 2, in the first embodiment, the insulating layer 35 locates on another surface of the semiconductor stack 1 opposite to the surface 11. The material of the insulating layer 35 can be chosen to have a transmittance higher than 90% to the light emitted from the semiconductor stack 1. The material of the insulating layer 35 can include oxide insulating material or non-oxide insulating material. The oxide insulating material can be silicon oxide ($SiO_x$), and the non-oxide insulating material can be benzocyclobutene (BCB), cyclic olefin copolymer (COC), fluorocarbon polymer or silicon nitride ($SiN_x$). In another embodiment, the insulating layer 35 can include a compound of fluoride, IIA-group elements, VII-group elements, such as calcium fluoride ($CaF_2$) or magnesium fluoride ($MgF_2$). In the first embodiment, a refractive index of the insulating layer 35 is smaller than that of the window layer 34 and the transparent conductive structure 33. Besides, a critical angle in an interface between the window layer 34 and the insulating layer 35 is smaller than a critical angle in an interface between the window layer 34 and the transparent conductive structure 33, in order to increase the probability of the total reflection incurred in the interface between the window layer 34 and the insulating layer 35 after the light emitted from the semiconductor stack 1 projects into the insulating layer 35. Besides, since the insulating layer 35 has low refractive index, the light which is not reflected at the interface between the window layer 34 and the transparent conductive structure 33 can also incur a total reflection between the interface of the transparent conductive structure 33 and the insulating layer 35. Thus, the light extraction efficiency of the semiconductor device 100 can be enhanced. For example, the refractive index of the insulating layer 35 can be lower than 1.4, and preferably 1.3~1.4. The transparent conductive structure 33 includes a first contact upper surface 33a contacting the window layer 34, and the insulating layer 35 includes a second contact upper surface 35a contacting the window layer 34. The first contact upper surface 33a and the second contact upper surface 35a are substantially coplanar. In one embodiment, a surface area of the first contact upper surface 33a is substantially 10%~50% of the sum of the surface areas of the first contact upper surface 33a and the second contact upper surface 35a, in order to improve the light emitting efficiency of the semiconductor device 100. In another embodiment, the second contact upper surface 35a can be a rough surface to scatter the light emitted from the semiconductor stack 1 and increase the light-emitting efficiency. The insulating layer 35 can be patterned to increase the current distribution of the semiconductor device 100. For example, the pattern of the insulating layer 35 can be regularly or irregularly distributed from the top view of the semiconductor device 100. In the first embodiment, the insulating layer 35 is substantially aligned with the extending electrode assemble 2a. On one hand, the current can spread evenly in the semiconductor stack 1, and on the other hand, the light under the extending electrode assemble 2a can be extracted through total reflection. In one embodiment, a thickness of the insulating layer is thinner than half of a thickness of the transparent conductive structure 33. In another embodiment, a thickness of the insulating layer is thinner than 20% of a thickness of the transparent conductive structure 33 to prevent the planarizing process after forming the transparent conductive structure 33 from destroying the structure of the insulating layer 35. In the first embodiment, at least one surface of the insulating layer 35 is covered by the transparent conductive structure 33 to increase the bonding area of the transparent conductive structure 33. Thus, the bonding ability between the insulating layer 35 and the window layer 34 is strengthened and the structural mechanical intensity can also be enhanced. In the first embodiment, the insulating layer 35 further includes a plurality of voids 351 through the insulating layer 35. The transparent conductive structure 33 fills in the plurality of voids 351 to form ohmic contact with the window layer 34.

In the first embodiment, the reflective structure 32 can be used to reflect the light emitted from the semiconductor stack 1 to increase the light extraction efficiency of the semiconductor device 100. The material of the reflective structure 32 can be but not limited to copper (Cu), aluminum (Al), tin (Sn), gold (Au), silver (Ag), Plumbum (Pb), titanium (Ti), nickel (Ni), Platinum (Pt), tungsten (W) or the alloy of the above mentioned materials. As shown in FIG. 2, in the embodiment, the reflective structure 32 includes a reflective layer 326, a reflective adhesive layer 324 under the reflective layer 326, a barrier layer 332 under the reflective adhesive layer 324 and an ohmic contact layer 320 under the barrier layer 322. The reflective layer 326 can reflect the light emitted from the semiconductor stack 1. The reflective adhesive layer 324 can be used to connect the reflective layer 326 and the barrier layer 322. The barrier layer 322 can be used to prevent the material of the conductive adhesive layer 31 from diffuse to the reflective layer 326 in the manufacturing process, and the structure and the reflectivity of the reflective layer 326 can be maintained. The ohmic contact layer 320 and the conductive adhesive layer 31 form ohmic contact. The conductive adhesive layer 31 can connect the substrate 30 to the reflective structure 32 and includes a plurality of the sublayers (not shown). The conductive adhesive layer 31 can include transparent conductive material or metal material. The transparent conductive material can be but not limited to indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), tungsten doped indium oxide (IWO), indium titanium oxide (ITiO), indium zinc oxide (IZO), indium gallium oxide (IGO), aluminum gallium zinc oxide (GAZO), graphene or the combination of the above material. The metal material can be but not limited to copper (Cu), aluminum (Al), tin (Sn), gold (Au), silver (Ag), plumbum (Pb), titanium (Ti), nickel (Ni), platinum (Pt), tungsten (W) or the alloy of the above materials.

The substrate 30 can be used to support the semiconductor stack 1 disposed thereon and other layer(s) or structure(s). The substrate 30 can be transparent, conductive, semiconductor or insulating. The semiconductor stack 1 can be formed on the substrate 30 or the other growth substrate by metal organic chemical vapor deposition (MOCVD), molecular beam epitaxy (MBE), hydride vapor deposition (HVPE) or other expitaxial growth method. If the semiconductor stack 1 is formed on the growth substrate, the semiconductor stack 1 bonds to the substrate 30 by substrate transfer technique, and the growth substrate can choose to be removed or retained. In the first embodiment, the semiconductor stack 1 is formed on the growth substrate and bonded to the substrate 30 by the conductive adhesive layer 31 through the substrate transfer technique. More specifically, the material of the substrate 30 can be but not limited to sapphire, diamond, glass, quart, acryl, epoxy, aluminum nitride (AlN), or includes but not limit to transparent conductive oxide (TCO), such as zinc oxide (ZnO), indium tin oxide (ITO), indium zinc oxide (IZO), gallium oxide ($Ga_2O_3$), lithium gallium oxide ($LiGaO_2$), lithium aluminum oxide ($LiAlO_2$) or aluminum magnesium oxide ($MgAl_2O_4$), or includes but not limited to semiconductor material, such as silicon carbide (SiC), gallium arsenide (GaAs), gallium phosphide (GaP), gallium arsenide phosphide (GaAsP), zinc selenide (ZnSe) or indium phosphide (InP), or can include but not limited to metal material, such as aluminum (Al), copper (Cu), molybdenum (Mo), tungsten (W) or the combination of the above elements.

Figure 3:
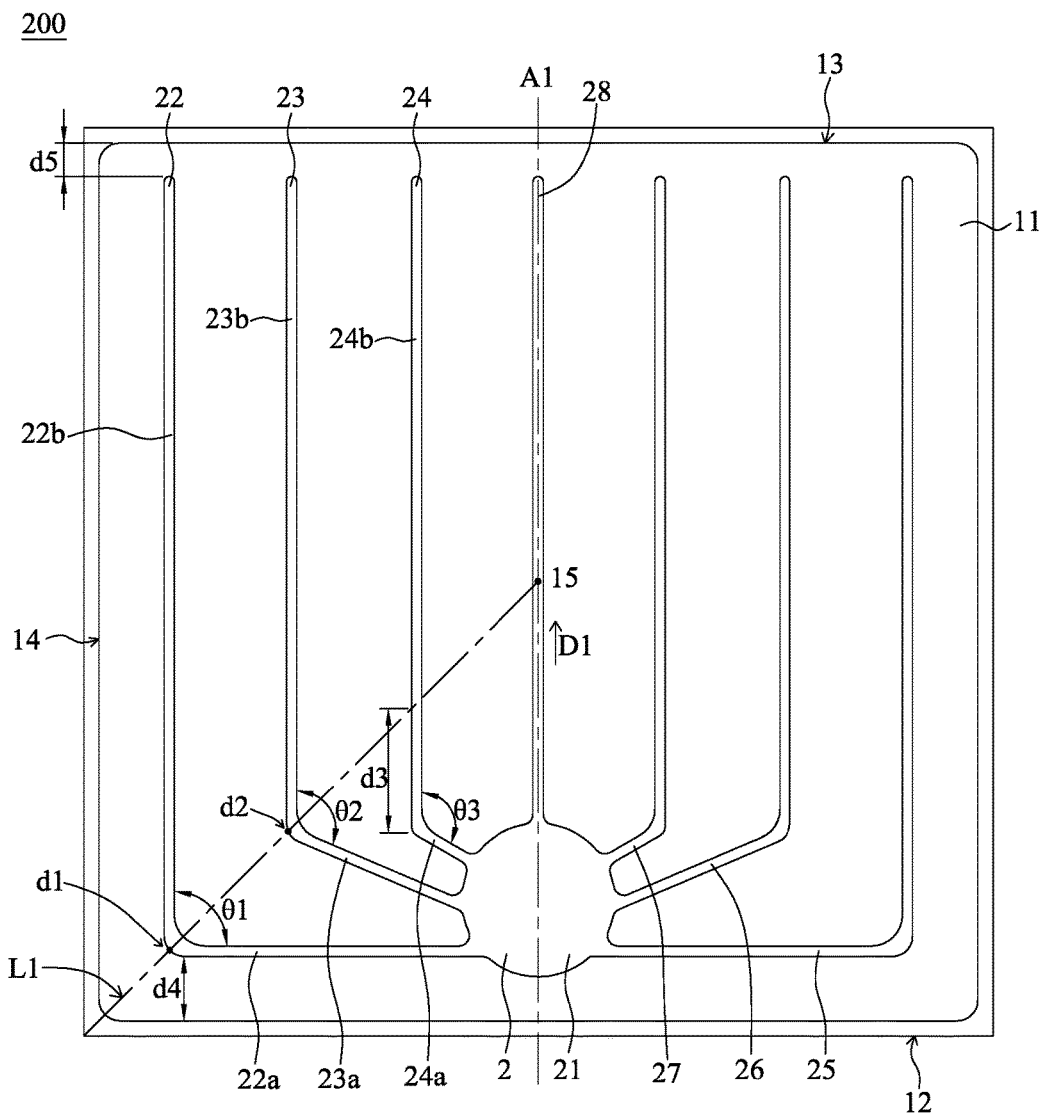
FIG. 3 illustrates a top view of a semiconductor device in accordance with the second embodiment of the present application.

FIG. 3 shows a top view of a semiconductor device 200 in accordance with the second embodiment. The elements and the connection relationship between the elements are substantially similar or the same as that in the first embodiment. In the second embodiment, the electrode structure 2 further includes a middle extending electrode 28 connecting to the electrode pad 21. From a top view of the semiconductor device 200, a distance between the middle extending electrode 28 and the lateral side 14 of the periphery P of the semiconductor stack 1 is larger than a distance between the third extending electrode 24 and the lateral side 14 of the periphery P of the semiconductor stack 1. The middle extending electrode 28 locates between the third extending electrode 24 and the sixth extending electrode 27. More specifically, the middle extending electrode 28 is substantially parallel to the virtual middle line A1 of the surface 11, or the middle extending electrode 28 substantially overlaps the virtual middle line A1. The middle extending electrode 28 extends from the electrode pad 21 toward the second side 13 along the first extending direction D1. In the embodiment, the shape of the middle extending electrode 28 is different from or unlike the shape of the first extending electrode 22, the second extending electrode 23 and the third extending electrode 24. For example, the middle extending electrode 28 is devoid of curve. In the second embodiment, the amount of the middle extending electrode 28 is one, but in some embodiments, the semiconductor device 200 can include a plurality of the middle extending electrode 28 to enhance the current spreading ability. The amount of the middle extending electrode 28 is not limited here.

Figure 4:
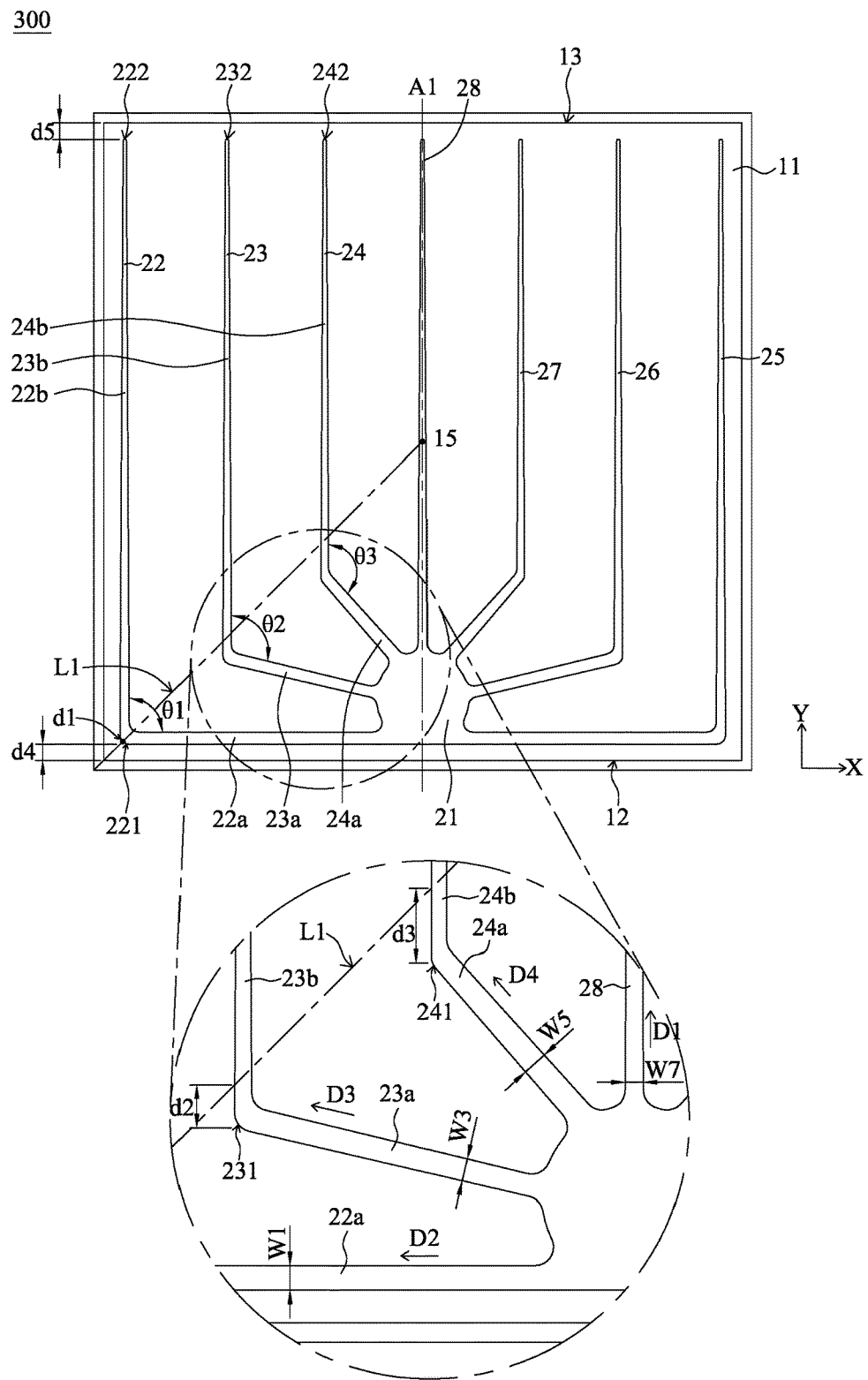
FIG. 4 illustrates a top view of a semiconductor device in accordance with the third embodiment of the present application.

FIG. 4 shows a top view of a semiconductor device in accordance with the third embodiment. The elements and the connection relationship between the elements are substantially similar or same as that in the second embodiment. In the third embodiment, the first extending electrode 22 of the semiconductor device 300 includes a various width, that is, the width of the first extending electrode 22 is uneven. The first part 22a of the first extending electrode 22 has an average width, and the second part 22b has another average width different from the average width of the first part 22a. The average width of the first part 22a is larger than the average width of the second part 22b. More specifically, the width of the first part 22a of the first extending electrode 22 is a first width W1. The width of the second part 22b becomes narrower toward the first end 222, and the first end 222 has a second width smaller than the first width W1. The first extending electrode 22 closer to the electrode pad 21 has a wider width, and the first extending electrode 22 away from the electrode pad 21 has a narrower width. Thus, the electrode structure 2 has the ability to quickly spread the current under the high current density operation (such as higher than 1 $A/mm^2$). In addition, the light shielded by the electrode structure 2 can be decreased and the balance between the light shielded and the current spreading ability can be achieved. Similarly, a width of the first part 23a of the second extending electrode 23 is a third width W3. The width of the second part 23b becomes narrower toward the second end 232, and the second end 232 has a fourth width smaller than the third width W3. A width of the first part 24a of the third extending electrode 24 is a fifth width W5. The width of the second part 24b becomes narrower toward the third end 242, and the third end 242 has a sixth width smaller than the fifth width W5. In the embodiment, the first width W1, the third width W3 and the fifth width W5 are substantially identical. The second width, the fourth width and the sixth width are substantially identical. However, the disclosure is not for the purpose to limit the scope. In another embodiment, the first width W1 is larger than the third width W3, and the third width W3 is larger than the fifth width W5. Moreover, in another embodiment, an end of the middle extending electrode 28 connecting to the electrode pad 21 has a seventh width W7, and the end close to second side 13 has an eighth width smaller than the seventh width W7. The first width W1, the third width W3 and the fifth width W5 are larger than the seventh width W7. In another embodiment, the first width W1, the third width W3 and the fifth width W5 are the same as the seventh W7. In the third embodiment, the ratio of the first width W1 to the second width is 1.5~8, and preferably 2~6, to achieve better current spreading ability. Thus, the reliability and the life of the semiconductor device 300 can be enhanced. In the above embodiment, the first width W1, the third width W3 and the fifth width W5 are the average width of the first parts 22a, 23a, 25a respectively. However, the first width W1, the third width W3 and the fifth width W5 are the maximum width or the minimum width of the first parts 22a, 23a, 25a respectively. The average width mentioned above can be calculated by an integral area of a specific part divided by a length perpendicular to a width. For example, the average width of the first part 22a is substantially equal to the integral area of the first part 22a from the top view of the semiconductor device 300 divided by the length which is perpendicular to the first side 12 of the first part 22a.

In one embodiment, from a top view of the semiconductor device, a feature length of the electrode pad 21 is larger than those of the extending electrodes 22~27. Preferably, the feature length of the electrode pad 21 is larger than 1.5 fold of that of the extending electrodes 22~27. The feature length in present disclosure refers to the longest distance between any two points on the periphery of one element. For example, the feature length of a circle refers to its diameter and the feature length of a rectangle refers to its diagonal.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments mentioned above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A semiconductor device, comprising:
   a semiconductor stack comprising a surface; and
   an electrode structure comprising an electrode pad formed on the surface, wherein the electrode structure further comprises a first extending electrode, a second extending electrode and a third extending electrode connecting to the electrode pad, and the first extending electrode is closer to a periphery of the surface than the third extending electrode is, and the second extending electrode is between the first extending electrode and the third extending electrode;
   wherein, from a top view of the semiconductor device, the first extending electrode, the second extending electrode and the third extending electrode respectively comprise a first curve having a first angle θ1, a second curve having a second angle θ2 and a third curve having a third angle θ3, wherein θ3>θ2>θ1.

2. The semiconductor device of claim 1, wherein from a top view of the semiconductor device, the surface comprises a center and a corner adjacent to the electrode pad, and a first virtual line connects the corner and the center, wherein a first distance is between the first curve and the first virtual line and a second distance is between the second curve and the first virtual line, and wherein the second distance is larger than the first distance.

3. The semiconductor device of claim 1, wherein from a top view of the semiconductor device, a surface area of the electrode pad is less than 5% of a surface area of the surface.

4. The semiconductor device of claim 1, wherein from a top view of the semiconductor device, the first extending electrode comprises a first end away from the electrode pad, and the surface comprises a center and a corner adjacent to the electrode pad, and a first virtual line connects the center and the corner and a second virtual line connects the center and the first end, wherein an angle between the first virtual line and the second virtual line is less than 120 degrees.

5. The semiconductor device of claim 4, wherein from a top view of the semiconductor device, the periphery comprises a first side and a second side opposite to the first side, and the second side is farther to the electrode pad than the first side to the electrode pad, and a smallest distance between the first side and the first extending electrode is larger than a smallest distance between the second side to the first end.

6. The semiconductor device of claim 1, wherein the electrode structure further comprises a fourth extending electrode connecting to the electrode pad, and from a top view of the semiconductor device, the fourth extending electrode is symmetric to the first extending electrode.

7. The semiconductor device of claim 1, wherein the electrode structure further comprises a fifth extending electrode connecting to the electrode pad, and from a top view of the semiconductor device, the fifth extending electrode is symmetric to the second extending electrode.

8. The semiconductor device of claim 1, wherein the electrode structure further comprises a middle extending electrode connecting to the electrode pad and the surface comprises a virtual middle line dividing the surface into two equal areas, and from a top view of the semiconductor device, the middle extending electrode is substantially parallel with the virtual middle line.

9. The semiconductor device of claim 8, wherein the middle extending electrode is devoid of curve and the amount of the middle extending electrode is one or more than one.

10. The semiconductor device of claim 1, further comprising an insulating layer on the other surface of the semiconductor stack opposite to the surface, and the insulating layer is substantially aligned with the first extending electrode, the second extending electrode and the third extending electrode of the electrode structure.

11. The semiconductor device of claim 1, wherein the first extending electrode comprises a first end away from the electrode pad and the second extending electrode comprises a second end away from the electrode pad, and a part of the first extending electrode between the first end and the first curve is substantially parallel to a part of the second extending electrode between the second end and the second curve.

12. The semiconductor device of claim 1, wherein the first extending electrode comprises a various width.

13. The semiconductor device of claim 12, wherein the first extending electrode comprises a first end away from the electrode pad, a first part between the electrode pad and the first curve and a second part between the first curve and the first end, wherein the first part comprises an average width and the second part comprises an average width different from the average width of the first part.

14. The semiconductor device of claim 1, wherein the semiconductor stack emit a light with a dominant wavelength of about 750 nm to 1500 nm.

* * * * *